United States Patent [19]
Cross

[11] Patent Number: 6,026,004
[45] Date of Patent: Feb. 15, 2000

[54] MODULAR HIGH VOLTAGE POWER SUPPLY WITH INTEGRAL FLUX LEAKAGE COMPENSATION

[75] Inventor: James D. Cross, Waterloo, Canada

[73] Assignee: Ruanduff Electrical Limited, County Dublin, Ireland

[21] Appl. No.: 09/216,976

[22] Filed: Dec. 21, 1998

[51] Int. Cl.⁷ .................................................. H02M 7/00
[52] U.S. Cl. ................... 363/68; 363/147; 363/59
[58] Field of Search .................. 363/68, 147, 59

[56] References Cited

U.S. PATENT DOCUMENTS

| | | | |
|---|---|---|---|
| 3,745,440 | 7/1973 | Lord | 321/26 |
| 4,266,269 | 5/1981 | Toba | 363/68 |
| 4,274,136 | 6/1981 | Onodera et al. | 363/68 |
| 4,338,657 | 7/1982 | Lisin et al. | 363/68 |
| 4,587,606 | 5/1986 | Sanada | 363/68 |
| 4,816,978 | 3/1989 | Domenget et al. | 363/21 |
| 4,858,098 | 8/1989 | Vincent | 363/45 |
| 4,977,491 | 12/1990 | Domenget et al. | 363/15 |
| 5,023,768 | 6/1991 | Collier | 363/68 |
| 5,060,128 | 10/1991 | Onodera et al. | 363/20 |
| 5,166,965 | 11/1992 | Collier | 378/101 |
| 5,631,815 | 5/1997 | Cross | 363/68 |

*Primary Examiner*—Shawn Riley
*Attorney, Agent, or Firm*—Ridout & Maybee

[57] ABSTRACT

A power supply for producing a high voltage DC output. The power supply comprises a primary winding and a series of secondary stages each having secondary windings coupled to the primary winding through a magnetic circuit. Each secondary stage comprises a printed circuit board with the secondary windings formed as a series of independent coils or turns on the board substrate. The magnetic circuit comprises a series of segments which are separated by an insulating film to maintain each segment at the same potential as the associated printed circuit board. Each coil includes a rectifier element for converting the induced AC voltage into a DC voltage. The rectifier elements are connected in series and the printed circuit boards are coupled to produce a high level DC voltage output signal, for example, a minimum 200 kV output. To compensate for Magneto Motive Force (MMF) losses through the insulating film, the rectifier elements include a compensation capacitor.

10 Claims, 5 Drawing Sheets

MODULAR HIGH VOLTAGE POWER SUPPLY WITH INTEGRAL FLUX LEAKAGE COMPENSATION

FIELD OF THE INVENTION

The present invention relates to high voltage power supplies, and more particularly to a modular device for generating a DC output voltage greater than 200 Kilo-Volts.

BACKGROUND OF THE INVENTION

In U.S. Pat. No. 5,631,815, the inventor in common to the subject invention describes a high voltage power supply in which a high voltage DC output is generated by magnetically coupling energy from a high frequency alternating electrical source to an arrangement of rectifier modules in the output stage. According to that invention, the rectifier modules and the associated magnetic coupling operate to limit the alternating voltages produced in the secondary windings to a level below the Paschen Minimum Voltage for the medium surrounding the rectifiers. Such a system facilitates the use of high frequency alternating voltages as the excitation source for the magnetic structure and eliminates partial discharges which are a serious insulation problem with alternating circuits at high voltage. High frequency excitation of the magnetic structure is desirable because it reduces the size of the structure required and similarly reduces the cost.

The High Voltage Power supply according to U.S. Pat. No. 5,631,815 uses an addition of many low voltages, which each are less than Paschen minimum or approximately 380 Volts, and as a result it is possible to use surface mount technology to construct the rectifier stages and to use printed circuit boards as carriers for the secondary windings and rectifier stages. Advantageously, this arrangement provides a reliable and low cost assembly suitable for operation at high frequency excitation. The modular nature of the arrangement makes it is possible to stack a large number of the voltage generating printed circuit boards to provide very high voltages. Provided that all printed circuit boards used in the supply are identical it is economical to create very high voltages by using a large number of the voltage generating boards connected in series.

In the power supply configurations discussed in U.S. Pat. No. 5,631,815 for the High Voltage Power Supply patent, the energy from the excitation source is provided to the secondary windings and rectifiers through magnetic coupling in a magnetic circuit or core. The magnetic core is assumed to be at ground potential and the voltage generating boards are insulated from the magnetic core. In practice that is a good design for moderately high voltages, say up to 200 kV. For higher voltages it becomes impractical to insulate the secondary windings of the supply from a grounded magnetic core at the high voltage end. This problem was encountered many years ago with high voltage power supplies excited with 60 Hz oscillations. The difficulty was overcome by segmenting the magnetic core and insulating the segments from each other with a polymer layer. The magnetic core segments were then maintained at a voltage level close to that of the neighbouring secondaries. Such a device, known as an Isolated Core Transformer or ICT was patented by Van der Graaf in the United States circa 1948.

It well known that even at 60 Hz there are problems associated with the use of an isolated core transformer especially at high currents. The segmentation of the magnetic core in the transformer introduces gaps in the magnetic structure with a permeability essentially that of air. This greatly increases the reluctance of the magnetic structure and produces leakage of magnetic flux. As a result the upper sections of the magnetic core carry less flux than the lower sections of the core, which results in a lower generated voltage per turn on the secondary windings. The leakage flux also gives rise to "leakage Reactance" in the equivalent circuit of the transformer. The leakage Reactance produces a drop in output voltage proportional to the load current. As a result of this leakage, an Isolated Core Transformer will exhibit a severe drop in output voltage with load current, i.e. voltage droop, and it is difficult to design an Isolated Core Transformer for very high voltages because of the loss of magnetic flux in the upper stages.

These inherent problems with Isolated Core Transformers operating at 60 Hz were addressed by Van der Graaf in the late 1940's and early 1950's. Van der Graaf overcame the problem to some extent by winding more turns on upper secondary coils. While this approach may be suitable for conventional ICT's, it is undesirable for the arrangement of voltage generating printed circuit board devices using surface mount technology in the high voltage power supply described in U.S. Pat. No. 5,631,815. One of the advantages of the high voltage power supply is the arrangement of identical voltage generating printed circuit boards for the output stages. The arrangement of identical voltage generating PCB's simplifies manufacturing and introduces economies of scale. Furthermore, the voltage generating PCB's result in an efficient utilization of the magnetic core structure. As a result, the application of Van der Graaf's techniques to the high voltage power supply would negate the inherent advantages of the design.

Another known approach in the art for addressing this problem is the "secondary excitation" technique. The secondary excitation approach involves providing an additional coil, similar in character to the primary, which is wound on the upper arm of the magnetic structure. The coil is connected to a capacitor to form a series resonant circuit with the coil. The value of the capacitor is selected to produce a resonant frequency close to the 60 Hz excitation. This technique is also referred to in the art as a "double tuning".

The "double tuning" approach is also unsuitable for the high voltage power supply described in U.S. Pat. No. 5,631,815. For high power high frequency operation of a DC power supply it is usually necessary to provide the AC input from a resonant inverter that converts the power of a low voltage DC bus into oscillations around 100 kHz. If the magnetic structure or the secondary circuits have a resonance close to that of the inverter, then control and stable operation is compromised. For this reason the conventional concept of double tuning is not suitable for the high voltage power supply.

In view of the foregoing, there remains a need for a unique arrangement for the high voltage power supply of U.S. Pat. No. 5,631,815, which provides an isolated core magnetic circuit without the inherent problems associated with leakage reluctance while maintaining the modularity of the output stages and providing the capability to achieve output voltages in excess of 200 kV DC.

BRIEF SUMMARY OF THE INVENTION

The present invention provides a high voltage power supply capable of producing output DC voltages in excess of 200 kV DC.

In one aspect, the present invention provides an apparatus for generating a DC output voltage in an environment subject to inclusion of a gaseous medium having a Paschen minimum voltage level, the apparatus comprises: (a) one or more substrate members; (b) one or more coils formed on a surface of each of the substrate members; (c) the substrate member including means for attaching a magnetic core having a primary winding for inductively coupling to the coils so that a voltage is induced in the coils in response to excitation of the primary winding by an alternating voltage, the magnetic core comprising a plurality of segments and isolation means for isolating adjacent segments so that each of the segments is maintained at the same potential as the associated substrate member; (d) each of the coils having a turns ratio wherein the induced voltage is no more than the Paschen minimum voltage; (e) a rectifier element connected to each of the coils for converting the induced voltage into a DC voltage component, and each of the rectifier elements including flux compensation means for compensating flux losses through the isolation means; and (f) the rectifier elements being coupled to produce a DC output voltage at an output port by summing a plurality of the DC voltage components.

In another aspect, the present invention provides a circuit board for an apparatus for generating a DC output voltage in an environment subject to inclusion of a gaseous medium having a Paschen minimum voltage level, the apparatus includes a primary winding and means for exciting the primary winding to generate an alternating current means for mounting one or more of the circuit boards and a voltage output port for outputting the DC voltage, the circuit board comprises: (a) a substrate member having two sides; (b) a plurality of coils formed on one side of the substrate member; (c) a magnetic core for inductively coupling the primary winding and the coils so that a voltage is induced in the coils in response to excitation of the primary winding by the alternating current; (d) each of the coils having a turns ratio wherein the induced voltage is no more than the Paschen minimum voltage; (e) a rectifier element connected to each of the coils for converting the induced voltage into a DC voltage component, and the rectifier elements being connected in series and having an output terminal for outputting the total of the DC voltage components, the output terminal being adapted for connecting to an input terminal on another circuit board or for coupling to the voltage output port; (f) an input terminal for connecting in series to another circuit board and receiving the DC voltage components from the other circuit board; and (9) the magnetic core comprising one or more magnetically permeable segments, each of the magnetically permeable segments being attached to the substrate member, and each of the magnetically permeable segments having a pair of opposed substantially flat surfaces suitable for contacting corresponding magnetically permeable segments on another circuit board, so that a plurality of circuit boards are stackable in the apparatus for generating a DC output voltage.

The high voltage power supply according to the following invention provides the following advantages:
(a) the flux compensation circuit results in uniform flux density in an insulated core transformer;
(b) the flux compensation circuit results in the voltage generation being equally distributed between identical boards and also results in low voltage droop of the supply with load current;
(c) the capacitors in the rectifier stages carry a very small current and do not require increasing the gauge of secondary windings;
(d) the resonant frequency of the flux compensation components is high and does not influence the operation of the resonant inverter which excites the primary winding.

As a result of the compensation being incorporated in the distributed voltage generation system, the voltage and current requirements of each component is low and compensation is incorporated at small cost into the boards during their automated manufacture. All of the voltage generating printed circuit boards are identical for a given high voltage power supply and the high voltage power supply retains its modular nature. This simplifies manufacture and assembly, and also the stocking of spare components.

BRIEF DESCRIPTION OF THE DRAWINGS

Reference will now be made, by way of example, to the accompanying figures, which show a preferred embodiment of the present invention, and in which.

DETAILED DESCRIPTION OF THE PREFERRED EMBODIMENTS

Figure 1:
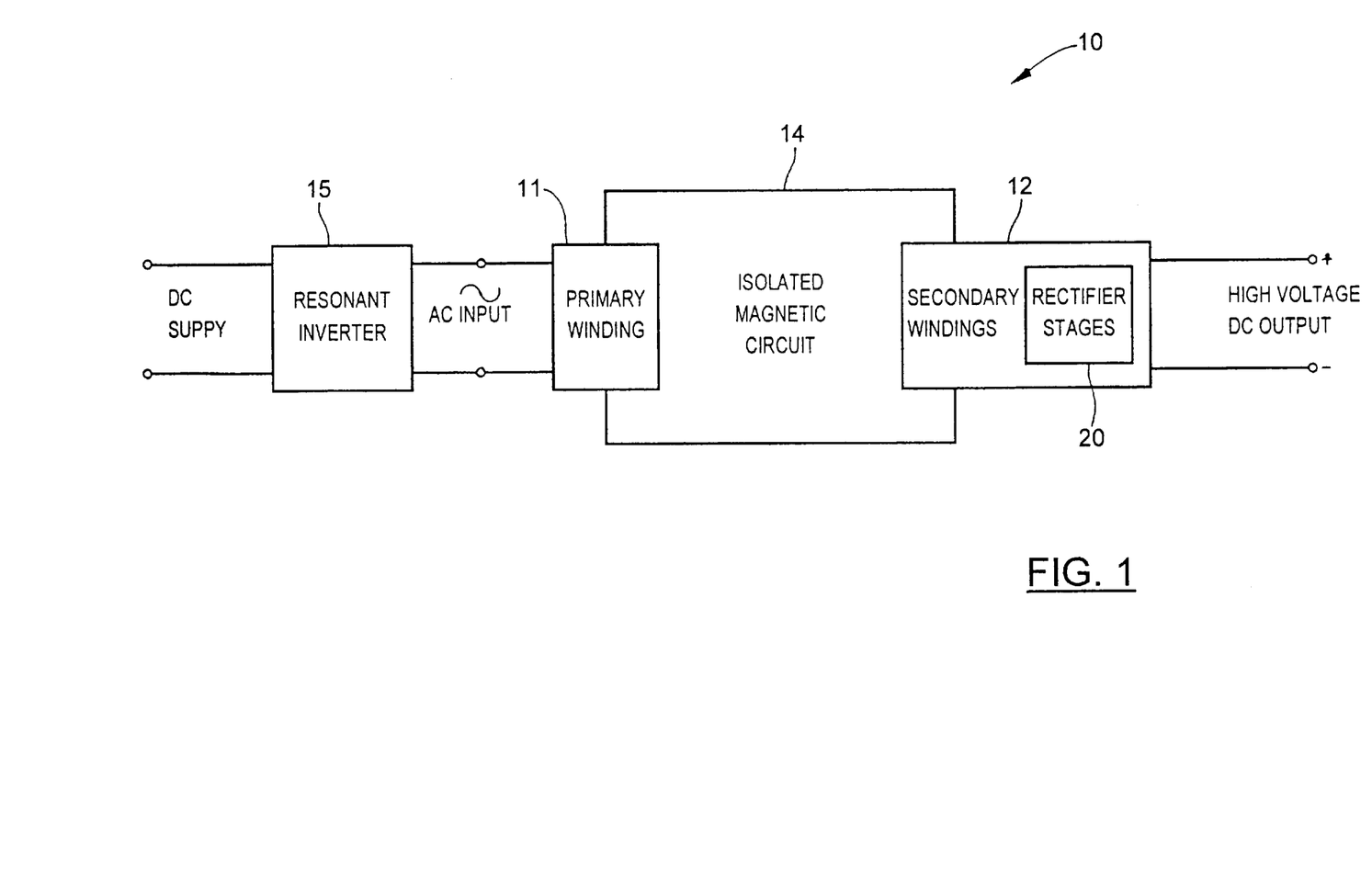
FIG. 1 is a block diagram of a high voltage power supply according to the present invention.

Reference is first made to FIG. 1, which shows in block diagram form a high voltage DC power supply 10 according to the present invention. The high voltage DC power supply 10 comprises a primary winding 11 which is coupled to a secondary stage 12 through a magnetic circuit with isolated segments 14. The primary winding 11 includes an input port which is energized by an AC input voltage. The AC input voltage to the primary winding 11 is generated by a resonant inverter 15. The resonant inverter 15 is of conventional design and converts a DC input voltage into a high frequency (e.g. 100 Kilo-Hertz) AC voltage which is then used to energize the primary winding 11. The AC input voltage is inductively coupled to the secondary stage 12 through the isolated magnetic circuit 14. As will be described in more detail below, the secondary stage 12 comprises a series of output modules 20. Each secondary output module 20, in turn, comprises a printed circuit board 21 and isolated magnetic segments or sections 22, 23.

Figure 2:
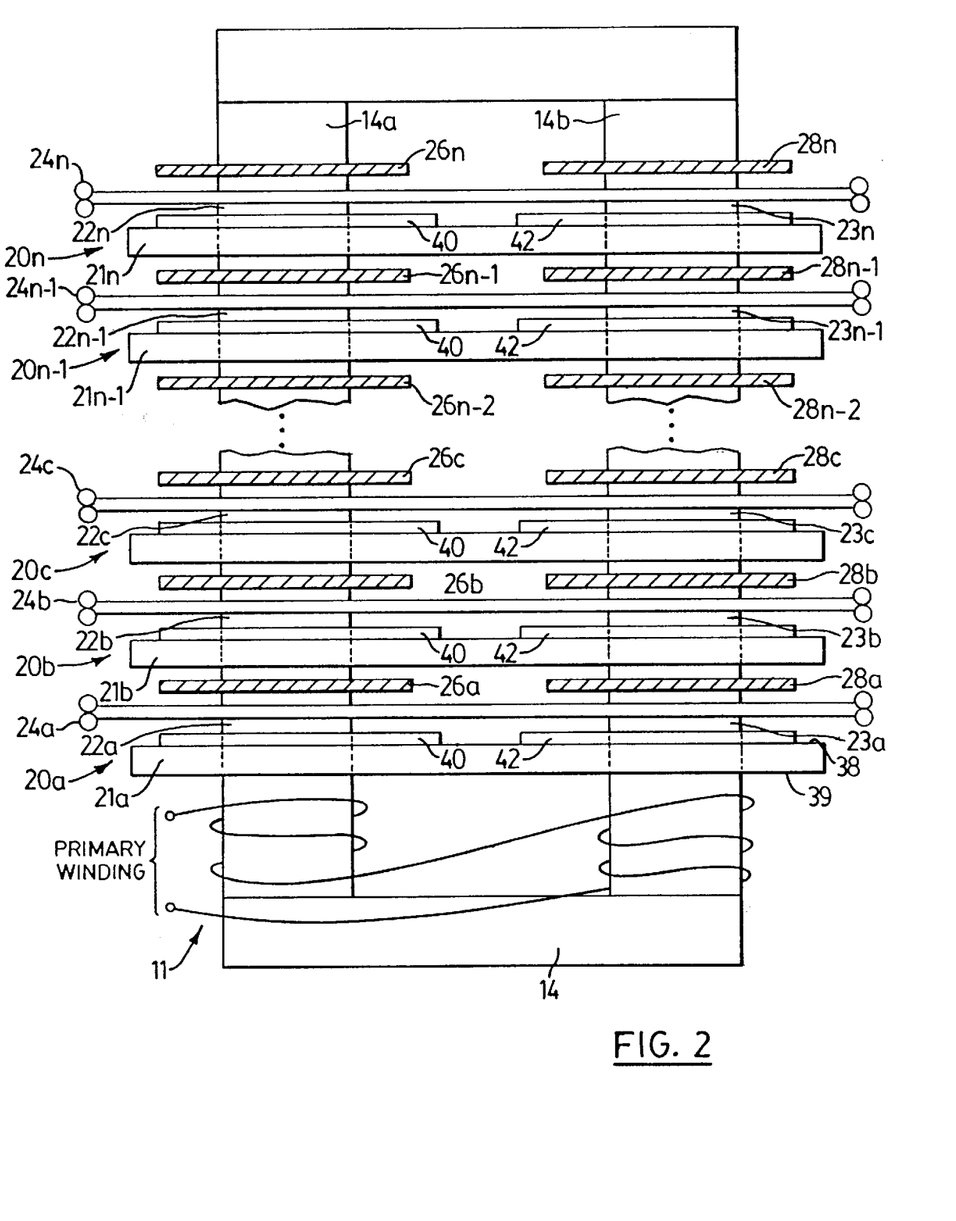
FIG. 2 is a schematic diagram of an embodiment of a high voltage power supply according to the present invention.
Figure 3:
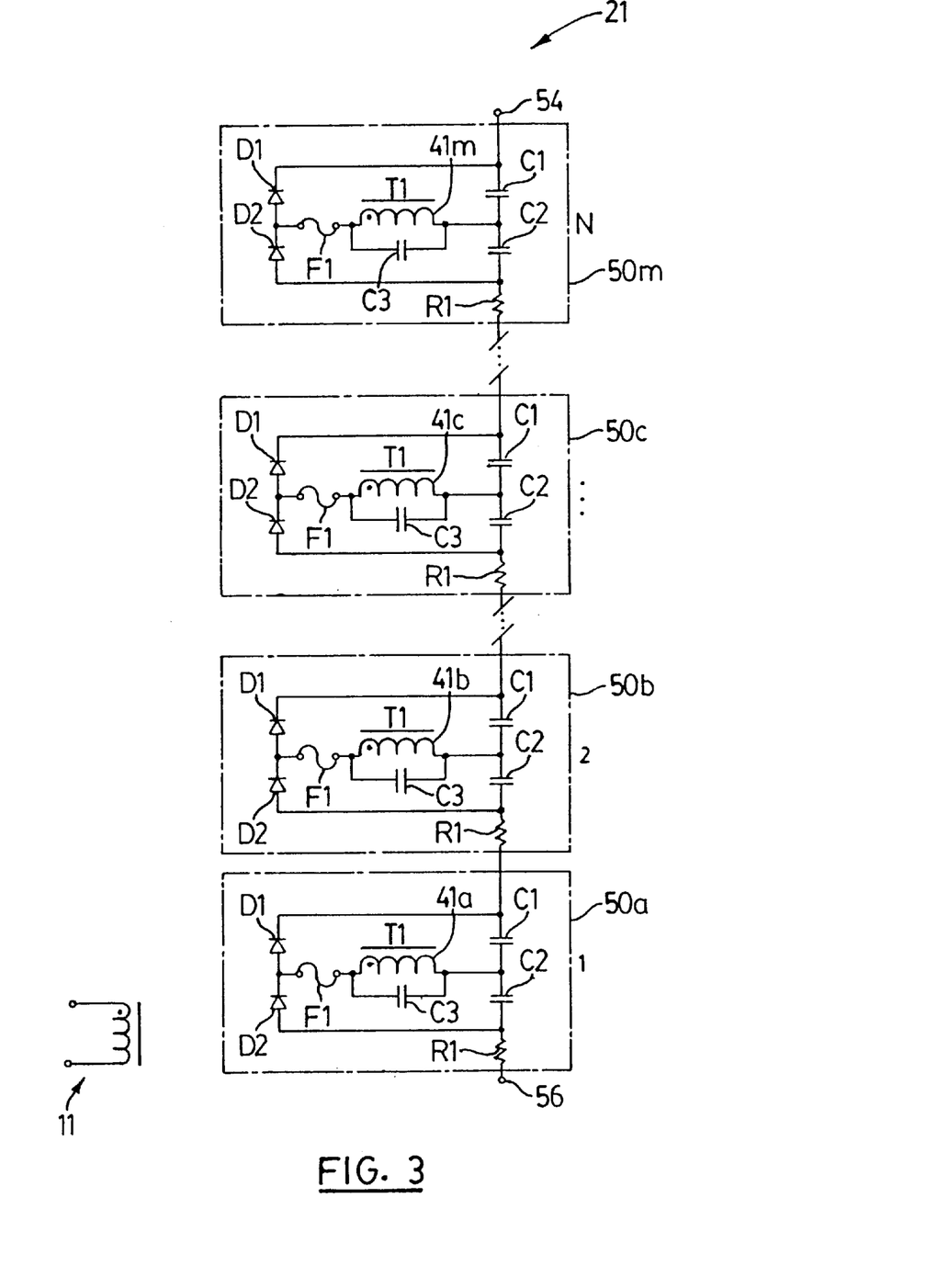
FIG. 3 is schematic diagram of a voltage generating output module for the high voltage power supply of FIG. 2 incorporating a flux compensation circuit according to the present invention.
Figure 4:
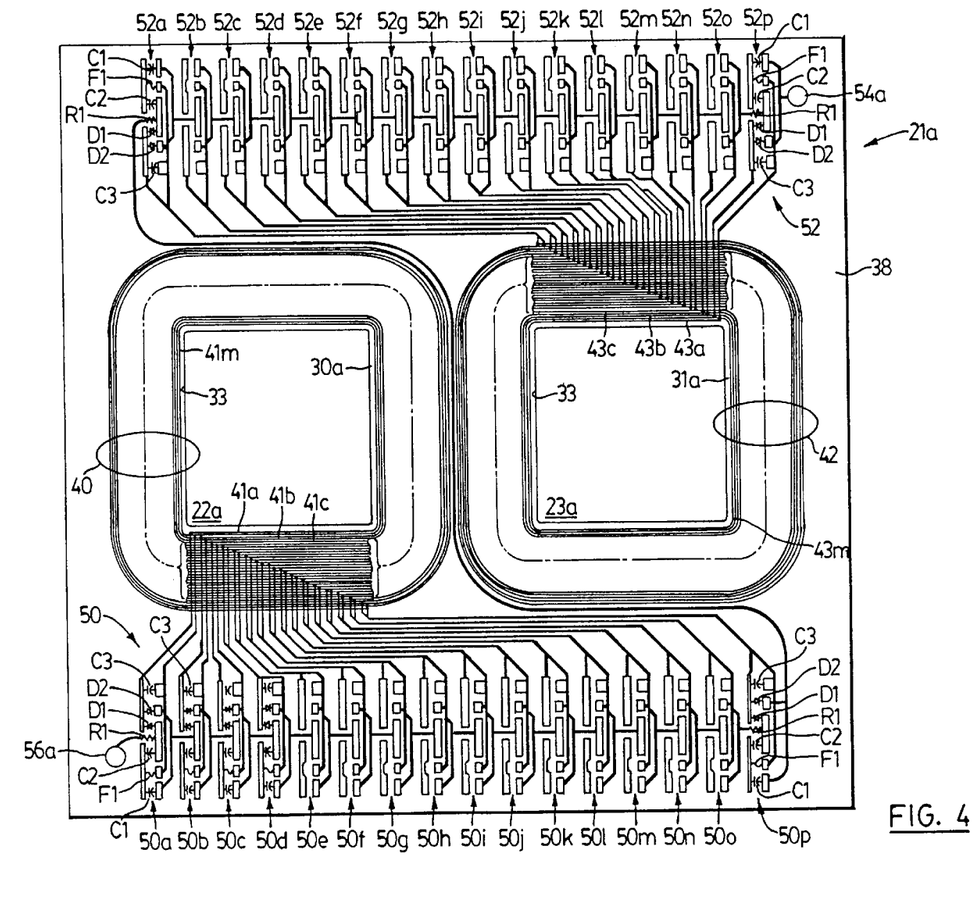
FIG. 4 is a schematic diagram of a printed circuit board module for the high voltage power supply of FIG. 2.

Reference is next made to FIG. 2, which shows an embodiment of the high voltage power supply 10 of FIG. 1 according to the present invention. The high voltage power supply 10 comprises the primary winding 11, the magnetic circuit 14, and a series of secondary voltage generating output modules 20. The magnetic circuit 14 comprises a pair of vertical arms 14a and 14b. The primary winding 11 is energized by the AC voltage output generated by the resonant inverter 15 (FIG. 1) and inductively coupled to each of the secondary voltage generating output modules 20. As depicted in FIG. 2, each of the secondary voltage generating output modules 20, shown individually as 20a, 20b, 20c, . . . , 20n−1, 20n, comprises a printed circuit board 21, shown individually as 21a, 21b, 21c, . . . , 21n−1, 21n, an isolated transformer section 22 and 23 for each vertical arm 14a and 14b, respectively, and a voltage grading ring 24, shown individually as 24a, 24b, 24c, . . . , 24n−1. Each printed circuit board 21 includes an arrangement of secondary windings 40, 42, one for each of the vertical arms 14*a*, 14*b*, and each of the secondary windings 40, 42 includes a series of respective rectifier stages 50 (as shown in FIG. 3) and 52 (FIG. 4). In this implementation, the secondary windings 40, 42 are arranged as tracks on the printed circuit board 21. The arrangement of the secondary windings 40, 42 and the rectifier stages 50, 52 are described in more detail below with reference to FIG. 4.

As shown in FIG. 2, the vertical arm 14*a* for the magnetic circuit 14 comprises transformer sections 22, shown individually as 22*a*, 22*b*, 22*c*, . . . , 22*n*–1, 22*n*. Similarly, the other vertical arm 14*b* comprises transformer sections 23, shown individually as 23*a*, 23*b*, 23*c*, . . . 23*n*–1, 23*n*. Each transformer section 22 or 23 comprises a flat tile of equal thickness made from a suitable ferrite material. The transformer sections 22, 23 are preferably ground flat on the contacting surfaces to minimise unplanned gaps. The transformer sections 22 and 23 are stacked to form the respective vertical arms 14*a* and 14*b* for the magnetic circuit 14.

As also shown in FIG. 2, each transformer section 22 or 23 is insulated or isolated from the adjacent transformer section 22 or 23 by a respective isolation layer 26 and 28. Adjacent transformer sections 22 in the vertical arm 14*a* are separated by isolation layers 26, shown individually as 26*a*, 26*b*, 26*c*, . . . , 26*n*–2, 26*n*–1 and 26*n*. In the other vertical arm 14*b*, the transformer sections 23 are separated by isolation layers 28, shown individually as 28*a*, 28*b*, 28*c*, . . . , 28*n*–2, 28*n*–1 and 28*n*. The isolation layers 26, 28 are preferably made from a material having high dielectric strength and good mechanical and thermal properties, such as Mylar film or Kapton material.

Referring to FIG. 4, each printed circuit board 21 includes a pair of openings 30*a* and 31*a* for fitting the respective transformer section (i.e. ferrite tile) 22 and 23. One transformer section is associated with each opening 30*a*, 31*a* in the printed circuit board 21. For example as depicted in FIG. 4, the transformer section 22*a* is mounted in the first opening 30*a*, and the transformer section 23*a* (for the second vertical arm 14*b*) is mounted in the second opening 31*a*. In the preferred embodiment, each transformer section (i.e. ferrite tile) 22 or 23 is secured to the opening 30 or 31 in the board 21 with a suitable adhesive compound denoted generally by 33. The transformer section 22*a* for the vertical arm 14*a* is encircled by the secondary windings 40. Similarly, the transformer section 23*a* for the other vertical arm is encircled by the other secondary windings 42. The secondary windings 40 comprise a number of secondary coils 41, shown individually as 41*a*, 41*b*, 41*c*. . . , 41*m*, and the secondary windings 42 comprise a number of secondary coils 43, shown individually as 43*a*, 43*b*, 43*c*, . . . , 43*m*. The respective coils 41, 43 are laid down as tracks on the substrate of the printed circuit board 21*a*.

This arrangement allows the printed circuit boards 21 to be treated as stacking elements. Spring contacts (not shown) connected to the voltage grading rings 24 (FIG. 2) are used to connect the boards 21 in series. Each pair of insulating layers 26 and 28 isolate each respective pair of associated transformer sections 22 and 23 from adjacent transformer sections and printed circuit boards, and the transformer sections 22 and 23 are at the same potential as the associated printed circuit board 21. For example, the second printed circuit board 21*b* and its transformer sections 22*b* and 23*b* are at the same potential and isolated from the first printed circuit board 21*a* by insulation layers 26*a* and 28*a* and isolated from the third printed circuit board 21*c* by insulation layers 26*c* and 28*c*.

Reference is next made to FIG. 3 which shows in schematic form the arrangement of the secondary windings 40 and the rectifier stages 50 for each of the printed circuit boards 21 for one of the vertical arms 14*a*. (The secondary windings 42 and the rectifier stages 52 for the other vertical arm 14*b* of the magnetic circuit 14 are arranged and function in a similar manner to that shown in FIG. 3.) Each secondary coil 41 in the windings 40 is magnetically coupled to the primary winding 11 through the magnetic circuit 14 (i.e. the ferrite tiles stacked to form the vertical arms 14*a* and 14*b* shown in FIG. 2). The secondary windings 40 on the printed circuit boards 21 are excited by applying a high frequency (typically 100 kHz) voltage from the resonant invertor 15 to the primary winding 11 comprising a small number of turns, typically 6. Each secondary coil 41 is also connected to a respective rectifier stage 50.

In the present description, the secondary coils 41, 43 are referred to a s single turns, i.e. having a 1:1 turns ratio with respect to the primary winding 11. It will, however, be appreciated that the limiting factor is the AC voltage level produced in the secondary coils 41 and 43, and therefore each single turn may be replaced by a small number of turns, for example 2 turns as shown in FIG. 4, provided the secondary AC voltage is limited to a value less than the Paschen minimum voltage, i.e. approximately 300 volts for air. In most applications, one turn on the secondary coil 41, 43 combined with doubling action of the rectifier stage 50, 52 is sufficient.

As shown in FIG. 3, each rectifier stage 50 according to the present invention comprises a pair of diodes D1, D2 and three capacitors C1, C2, C3. The diodes D1, D2 are connected to the capacitors C1, C2 to form a voltage doubler circuit as will be within the understanding of one skilled in the art. The diodes D1, D2 are selected to have sufficient current capacity to carry the load current and sufficient voltage capacity to withstand the AC voltages induced in the secondary windings 40 (or 42). The capacitors C1, C2 are selected according to the ripple reduction desired in the rectified AC, i.e. DC output. Since the voltages generated in the secondary coils 41 (or 43) are below the Paschen minimum voltage, low voltage components may be utilized for the diodes D1, D2. Adjacent rectifier stages 50 (or 52) are connected in series through a resistor R1 to produce a high voltage DC output at an output terminal 54. The resistor R1 provides protection against large currents flowing in the boards 21. To provide further protection, each of the rectifier stages 50 includes a respective fuse F1. The board 21 also includes an input terminal 56. The input and output terminals 56 and 54 are electrically connected to the associated grading rings 24 (FIG. 2) and allow the printed circuit boards 21 to be coupled together in series.

The insulated transformer sections 22 and 23 allow the high voltage power supply 10 to generate a DC output voltage greater than 200 kV by isolating the printed circuit boards 21 so that the respective secondary windings 40 are at the same potential as the associated transformer sections 22 and 23.

As shown in FIG. 3, each rectifier stage 50 also includes the third capacitor C3 which is connected across the secondary coil 41. The purpose of the capacitor C3 is to compensate for leakage flux or leakage reactance, i.e. flux which is lost through the isolation layers 26, 28 between adjacent transformer sections 22, 23. The problem of leakage flux arises because the isolation layers 26, 28 (i.e. gaps) in the magnetic core 14 have a large reluctance and the passage of flux through a reluctance produces a drop of Magneto Motive Force or MMF.

In accordance with this aspect of the invention, the function of the capacitor C3 (i.e. the flux compensation capacitor) is to produce a flow of current of the correct phase to provide a Magneto Motive Force (MMF) that cancels the MMF loss due to the gap reluctance. The flux compensation capacitor C3 generates a current which is proportional to and at the same location as the current corresponding to the MMF lost by each gap so that the passage of flux through the isolation layers 26, 28 (i.e. gaps) results in no net loss of MMF and the flux throughout the magnetic circuit 14 remains constant. Advantageously, the arrangement of the flux compensation capacitor C3 ensures equal voltage generation in all the stages (i.e. printed circuit boards 21 in the output stage) and makes it possible to reliably produce output voltages in excess of 200 KV using the high voltage power supply 10. A further benefit of the flux compensation arrangement is a resultant low leakage reactance for the magnetic circuit 14 which in turn minimizes voltage droop with current draw from the supply 10.

The current I in the secondary coil 41 (or 43) as a result of the flux compensation capacitor C3 may be calculated as follows:

The coil 41 is connected to the capacitor C3 and allows a current I to flow, where $$I = \frac{emf}{reactance} = N\omega\Phi \cdot \omega c$$

where, $N$ is the number of turns in the secondary coil
$\omega$ is the circular frequency of excitation
$\Phi$ is the time varying flux
$c$ is the capacitance value for the compensation capacitor C3

The current I flows through N turns and this produces a magneto motive force (MMF) given as, $$MMF(\text{produced}) = N^2 \omega^2 c \Phi$$

If the MMF produced is made equal to the MMF drop, then compensation is achieved, and $$N^2 \omega^2 c \Phi = R \Phi$$

or $$c = R/(N^2 \omega^2) \quad (1)$$

where R is the reluctance of the gap or isolation layer for proper compensation.

For an air gap having a cross-sectional area A and a thickness l, the Reluctance R is given by $$R = l/(\mu_o A)$$

where $\mu_o$ is the permeability of free space

A flux $\Phi$ passing through a Reluctance R results in a drop of Magneto Motive Force ($MMF_{drop}$) as follows, $$MMF_{drop} = \Phi R$$

The coil 41a which encircles a core section 22a (FIG. 4) and carries a time varying flux $\Phi$ will have an electro-motive force (emf) induced with a magnitude determined as $$|emf| = N\omega\Phi$$

for a coil of N turns which links a flux $\Phi$ varying at a circular frequency $\omega$.

Referring back to FIG. 4, the value for the flux compensation capacitor C3 is selected so that all the secondary coils 41 (and 43) on the board 21 generate exactly enough MMF to compensate for the MMF drop in one layer of the gap between segments 22 or 23. For the arrangement shown in FIG. 4, the gap between transformer sections 22, 23 is approximately 0.010" and the area of each transformer section 22, 23 (FIG. 4) is approximately 16 in². The total Reluctance R to be compensated by the 32 compensation capacitors C3 is approximately 800. For an excitation frequency of 100 KHz. (as described above), the circular frequency $\omega$ is 2 Π×100,000, and the value for the compensation capacitor C3 is determined from the equation (1) above as follows, $$c = R/(N^2\omega^2) = 800/(2 \times 2\ \Pi \times 100,000)^2$$

$$C = 500 \times 10^{-12}\ \text{Farads or 0.5 nF}$$

The extra current produced in each coil (i.e. track) by the capacitor C3 is approximately 0.063 A for a generated voltage of 200V or 100V/turn. This additional current is negligible and will not overly stress the individual coils 41 or 43.

Advantageously, the capacitors C3 with capacitance values in the 0.5 nF range are suitably manufactured as surface mount components which, in turn, facilitates the manufacture of the printed circuit boards 21 according to the invention.

Figure 5:
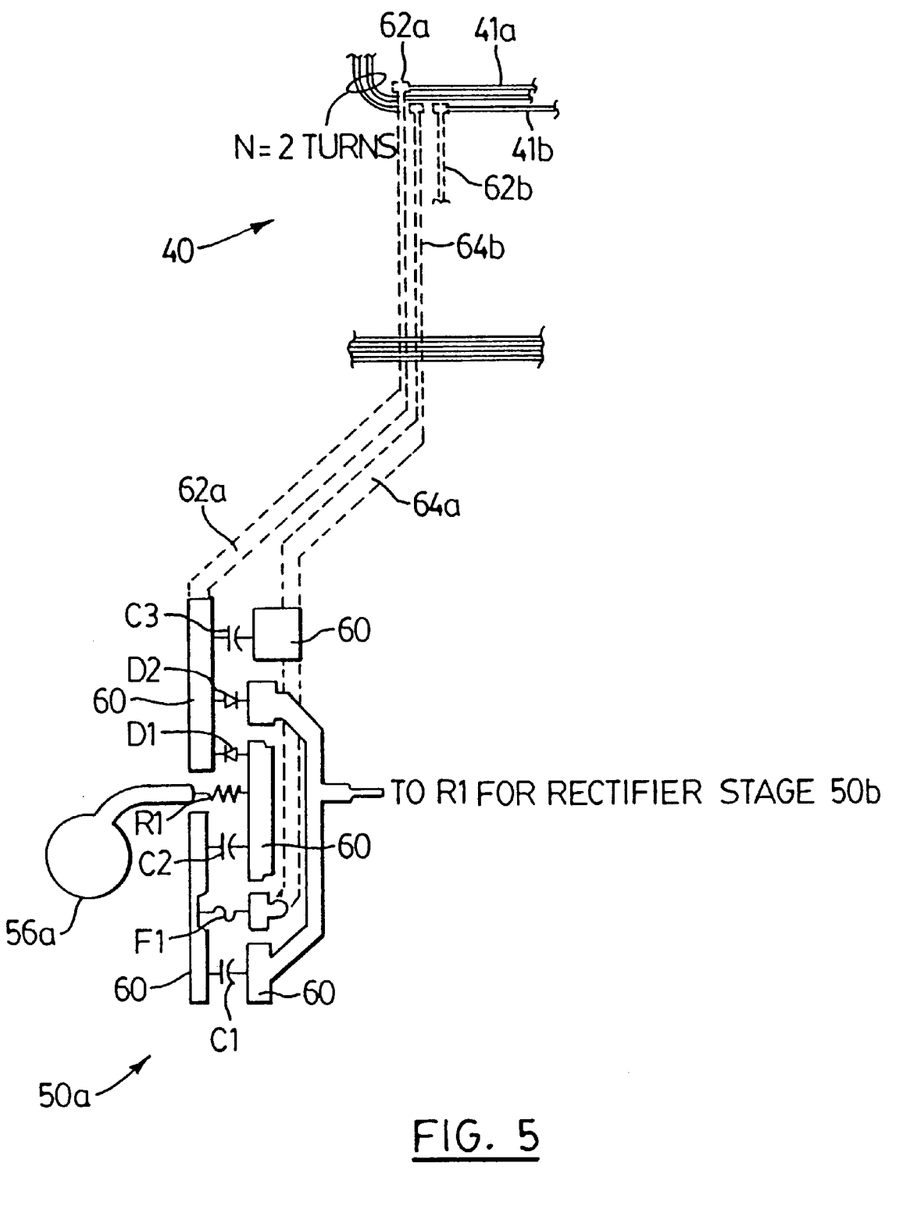
FIG. 5 is an enlarged view of a rectifier stage on the printed circuit board of FIG. 4.

Reference is made to FIG. 4 and FIG. 5, each printed circuit board 21 includes the secondary windings 40, 42 and the rectifier stages 50, 52. FIG. 5 is an enlarged view of one the rectifier stages 50a. As described above, the secondary windings 40, 42 comprise a number of secondary coils 41, 43 with each coil 41, 43 being coupled to one of the respective rectifier stages 50, 52. The printed circuit board 21 preferably comprises a two-sided printed circuit board or PCB having one side indicated by reference 38 and another side indicated by reference 39 (FIG. 2). The secondary coils 41, 43 are laid out on the side 38 of the board 21 and connected to component mounting pads 44, for the diodes D1, D2 and capacitors C1, C2, C3 for each rectifier stage 50 and 52. The rectifier stages 50 and 52 in FIG. 4 are indicated individually as 50a, 50b, 50c, 50d, 50e to 50p, and as 52a, 52b, 52c, 50d, 50e to 52p, respectively. As shown in FIG. 5, the components in the rectifier stage 50a are soldered to conductive pads indicated generally by 60 and coupled to the respective secondary coil 41a through tracks 62a and 64a, where track 62a is coupled to one end of the secondary coil 41a and track 64a is coupled to the other end of the coil 41a. The tracks 62a and 64a are shown in broken outline to indicate that the tracks are on the other side 39 of the board 21. For the embodiment shown in FIG. 4, each secondary coil 41, 43 comprises two turns (i.e. N=2). The rectifier stages 50 are connected in series through the resistors R1. The rectifier stage 50p is connected in series to the rectifier stage 52a through a track 51 (located on the other side 39 of the board) as shown in FIG. 4. The first rectifier stage 50a provides a negative DC output terminal 56a, while the last rectifier stage 52p provides a positive DC output terminal 54a. The polarity of the output from the board 21 is reversed by switching connections to the first rectifier stage 50a and the last rectifier stage 52p.

It has been found that a high voltage power supply incorporating the flux compensation and isolation arrangement according to the present invention can generate an output voltage in excess of one million volts and the delivery of high power at those voltages.

The present invention may be embodied in other specific forms without departing from the spirit or essential characteristics thereof. Therefore, the presently discussed embodiments are considered to be illustrative and not restrictive, the scope of the invention being indicated by the appended claims rather than the foregoing description, and all changes which come within the meaning and range of equivalency of the claims are therefore intended to be embraced therein.

What is claimed is:

1. An apparatus for generating a DC output voltage in an environment subject to inclusion of a gaseous medium having a Paschen minimum voltage level, said apparatus comprising:

(a) a plurality of substrate members;
   (b) a plurality of coils formed on a surface of each of said substrate members;
   (c) said substrate member including means for coupling a magnetic core having a primary winding for inductively coupling to said coils so that a voltage is induced in said coils in response to excitation of said primary winding by an alternating voltage, said magnetic core comprising a plurality of segments and isolation means for isolating adjacent segments so that each of said segments is maintained at the same potential as an associated substrate member;
   (d) each of said coils having a turns ratio wherein said induced voltage is no more than the Paschen minimum voltage;
   (e) a rectifier element connected to each of said coils for converting said induced voltage into a DC voltage component, and each of said rectifier elements including flux compensation means for compensating Magneto Motive Force losses through said isolation means; and
   (f) said rectifier elements being coupled to produce a DC output voltage at an output port by summing a plurality of said DC voltage components.

2. The apparatus as claimed in claim 1, wherein said magnetic core comprises first and second arms, said first arm being associated with a first group of said coils, and said second arm being associated with a second group of said coils, and one of the rectifier elements in said first group being coupled in series to one of the rectifier elements in said second group of coils.

3. The apparatus as claimed in claim 2, wherein said isolation means comprises an electrical insulating material comprising Mylar or Kapton.

4. The apparatus as claimed in claim 3, wherein each of said rectifier elements comprises a voltage doubler circuit, and said compensation means comprises a capacitor having a capacitance value selected to produce a current having a magnitude yielding a MMF substantially equal to the MMF lost through said isolation means.

5. The apparatus as claimed in claim 1, wherein said substrate member comprises a two-sided printed circuit board, and said coils comprise tracks formed on one side of said board, said rectifier elements being mounted on the other side of said board and electrically connected to said respective coils.

6. The apparatus as claimed in claim 5, wherein each of said segments comprise a ferrite tile attached to said printed circuit board, and each of said ferrite tiles includes a pair of opposed substantially flat surfaces suitable for contacting corresponding ferrite tiles in an adjacent printed circuit board.

7. A circuit board for an apparatus for generating a DC output voltage in an environment subject to inclusion of a gaseous medium having a Paschen minimum voltage level, said apparatus including a primary winding and means for exciting the primary winding to generate an alternating current, means for mounting one or more of the circuit boards and a voltage output port for outputting the DC voltage, said circuit board comprising:

(a) a substrate member having two sides;
   (b) a plurality of coils formed on one side of said substrate member;
   (c) a magnetic core for inductively coupling said primary winding and said coils so that a voltage is induced in said coils in response to excitation of said primary winding by the alternating current;
   (d) each of said coils having a turns ratio wherein said induced voltage is no more than the Paschen minimum voltage;
   (e) a rectifier element connected to each of said coils for converting said induced voltage into a DC voltage component, and said rectifier elements being connected in series and having an output terminal for outputting the total of said DC voltage components, said output terminal being adapted for connecting to an input terminal on another circuit board or for coupling to said voltage output port;
   (f) an input terminal for connecting in series to another circuit board and receiving the DC voltage components from said other circuit board; and
   (g) said magnetic core comprising one or more magnetically permeable segments, each of said magnetically permeable segments being attached to the substrate member, and each of said magnetically permeable segments having a pair of opposed substantially flat surfaces suitable for contacting corresponding magnetically permeable segments on another circuit board, so that a plurality of circuit boards are stackable in the apparatus for generating a DC output voltage.

8. The circuit board as claimed in claim 7, further including isolation means for isolating the magnetically permeable segments from segments in adjacent circuit boards so that each of said segments is maintained at the same potential as the circuit board carrying the segments.

9. The circuit board as claimed in claim 8, wherein each of said rectifier elements include flux compensation means for compensating Magneto Motive Force losses through said isolation means.

10. The circuit board as claimed in claim 9, wherein each of said rectifier elements comprises a voltage doubler circuit, and said compensation means comprises a capacitor having a capacitance value selected to produce a current having a magnitude yielding a MMF substantially equal to the MMF lost through said isolation means.

* * * * *